United States Patent [19]

Laudenslager et al.

[11] 4,275,317
[45] Jun. 23, 1981

[54] PULSE SWITCHING FOR HIGH ENERGY LASERS

[76] Inventors: Robert A. Frosch, Administrator of the National Aeronautics and Space Administration, with respect to an invention of James B. Laudenslager, Sierra Madre; Thomas J. Pacala, Los Angeles, both of Calif.

[21] Appl. No.: 23,485

[22] Filed: Mar. 23, 1979

[51] Int. Cl.³ .................... G11C 13/02; H01J 3/10
[52] U.S. Cl. .................. 307/415; 328/67; 331/94.5 G; 331/94.5 PE; 333/20
[58] Field of Search .................. 333/20, 158, 160; 328/65, 67; 307/106, 284, 415; 331/94.5 G, 94.5 PE

[56] References Cited

U.S. PATENT DOCUMENTS

| | | | |
|---|---|---|---|
| 3,243,734 | 3/1966 | Bartik | 333/20 |
| 3,737,679 | 6/1973 | Cooper | 328/67 |
| 3,832,568 | 8/1974 | Wang | 328/67 |

Primary Examiner—James W. Moffitt
Attorney, Agent, or Firm—Monte F. Mott; John R. Manning; Paul F. McCaul

[57] ABSTRACT

A saturable inductor switch for compressing the width and sharpening the rise time of high voltage pulses from a relatively slow rise time, high voltage generator to an electric discharge gas laser (EDGL). The switch also provides a capability for efficient energy transfer from a high impedance primary source to an intermediate low impedance laser discharge network. More specifically, a saturable inductor switch is positioned with respect to a capacitive storage device, such as a coaxial cable, so that when a charge build-up in the storage device reaches a predetermined level, saturation of the switch inductor releases or switches energy stored in the capacitive storage device to the EDGL. Also disclosed are cascaded saturable inductor switches for providing output pulses having rise times of less than ten nanoseconds as required for efficient excitation of EDGL's, the pulse rise time being determined by the thickness of a high permeability material forming the saturable inductor switch. In addition, a technique for magnetically biasing the saturable inductor switch is disclosed so that only pulses from a pulse generator having one polarity are passed and pulses having the other polarity are blocked, thereby improving the lifetime of electrical components that are sensitive to voltage reversals.

19 Claims, 10 Drawing Figures

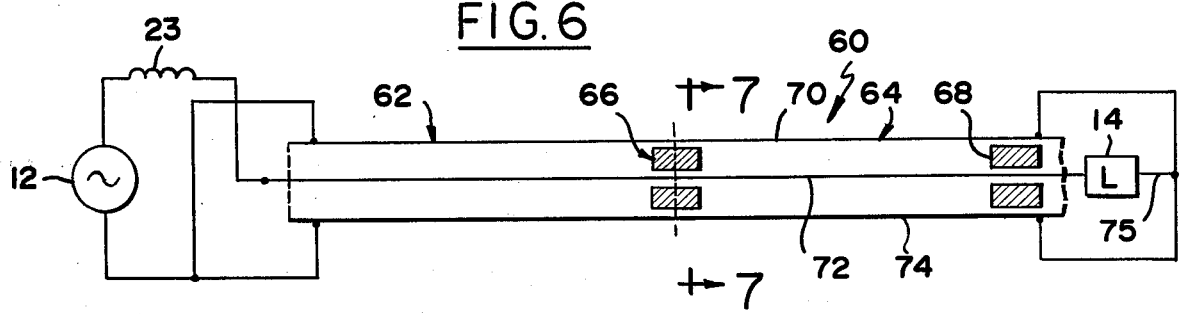
FIG. 6
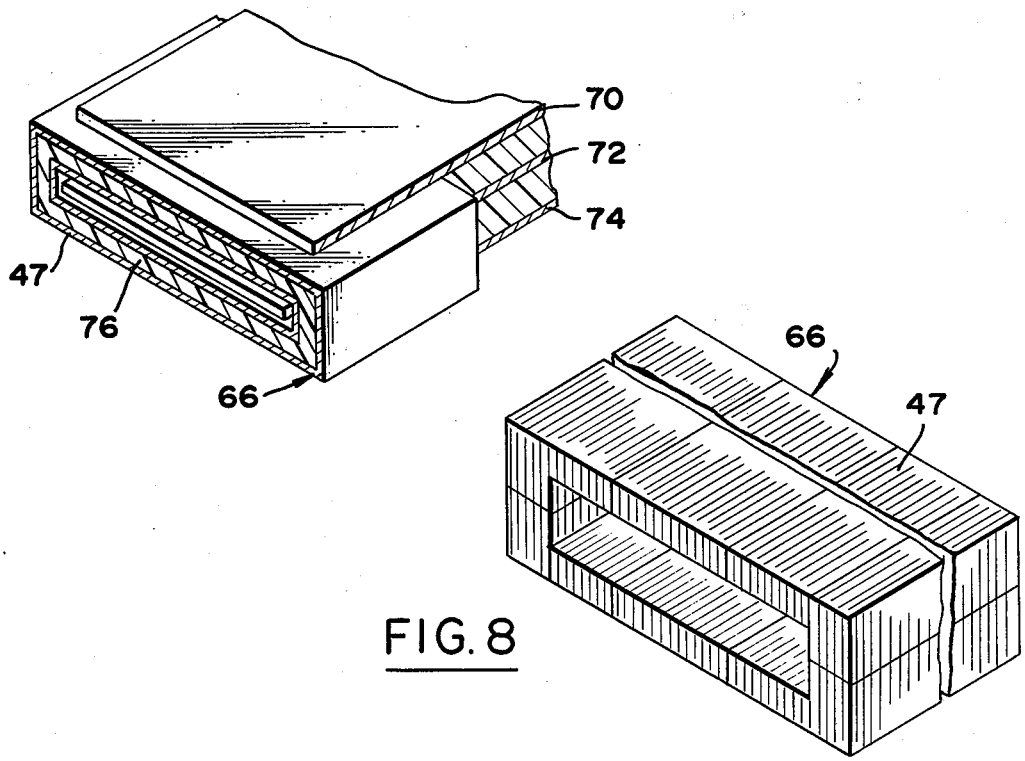
FIG. 7
FIG. 8
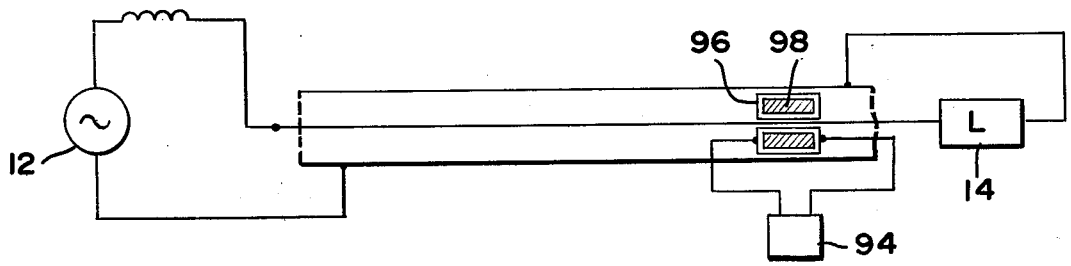
FIG. 10

PULSE SWITCHING FOR HIGH ENERGY LASERS

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

FIELD OF THE INVENTION

The invention relates to pulse rise-time sharpening, pulse width compression and impedance matching circuits in which high power, high voltage, fast rise time, short output pulses are provided to an electric discharge gas laser.

BACKGROUND OF THE INVENTION

Electronic transition lasers such as rare gas excimer, dimer, and charge transfer lasers offer scalable high energy photon sources in the ultraviolet and visible wavelengths. These new lasers have high efficiencies and can be scaled to high pulsed output energies by increasing the volume, pressure and energy deposition into a high pressure gas mixture contained within the lasers. Rare gas halide electronic transition lasers operate on similar principles. First, an intense source of electron excitation either from an electron beam, a high voltage self-sustained electric discharge, or an electron beam sustained discharge is used to excite mixtures of rare gases plus a small percentage of a molecular additive. A rare gas is a dominant component of the mixture because the electron excitation is initially deposited into ionization and excitation of the rare gas. Operation of these lasers at high total pressures is necessary for their proper operation. Large volume, self-sustained glow discharges have been extremely difficult to achieve at high pressure unless special precautions are taken because high pressure glow discharges rapidly form an instability and convert to an arc discharge. Arc discharges tend to constrict into small streamers thereby eliminating the volume excitation necessary for proper laser operation. For this reason, electron beams have been used as the primary excitation method for rare gas excitation transfer lasers.

Although the electron beam method provides a well controlled and well characterized source of excitation of high pressure gases, it does have serious practical limitations which make self-sustained discharge excitation an useful alternate method. An efficient high pressure electric discharge for electronic transition lasers is characterized by a discharge that is volumetric and stable (i.e., does not degenerate into a constricted arc). The electron energy in the discharge should be high enough to produce sufficient rare gas ions and metastables and have a sufficiently high current density in order to produce a sufficient number of excited rare gas species in a short time period which is less than the time required to react all of the molecular additive. These three criteria require a high voltage, high energy discharge circuit incorporating some method for stabilizing the discharge to prevent arcing.

Many problems have been encountered in the efficient design of discharge circuitry necessary to produce the high electron temperatures required in high pressure rare gas buffered mixtures. Typical problems are that the gas tends to break down at too low a voltage. Also, discharges at electron energies necessary for efficient pumping of the laser tend to constrict into an arc unless the discharge pule has a very steep rate of rise (under 100 nanoseconds) and the duration is kept shorter than the arc formation time or the time to react all the molecular additive. The gas after breakdown has a very low impedance (i.e., less than several ohms) which necessitates a low impedance electric discharge pulse forming circuit for efficient energy deposition into an electric discharge gas laser (EDGL) load. In addition, high voltage and high energy charging circuits (e.g., Marx generators, L-C generators, or transformers) typically have too large an inductance to provide either a rapid voltage rise time or a sufficiently low output impedance for optimum energy transfer to EDGL's. Thus, a key problem associated with these types of lasers is the development of an efficient, long lived, non-destructive, non ablative reliable and inexpensive method of electron energy deposition into the lasers. The pulse rise time shaping, pulse width compression and impedance matching circuitry of the present invention solves the above problems.

SUMMARY OF THE INVENTION

The present invention provides a circuit for the purpose of efficient energy transfer from relatively slow high voltage, high energy generators to EDGL's that comprises one or more saturable inductor switches each of which has an associated distributed capacitance energy storage device. Energy is provided to the distributed capacitance storage device by a voltage source and is contained therein by the saturable inductor switch. When the energy build-up reaches a predetermined level, the switch becomes saturated, thereby allowing the energy to flow therethrough and into either a next intermediate storage device or an EDGL load. Distributed capacitance energy storage devices which can be used include coaxial lines, multiple coaxial lines, parallel plate transmission lines or two or more parallel-connected capacitors having an associated natural or added inductance for creating a pulse forming network. As will be explained, distributed capacitance energy storage devices must be utilized in order to provide the high voltage, narrow pulses required by electronic transition lasers.

In order to achieve efficient operation of an EDGL, a pulse shaping network providing less than 10 nanosecond rise time output pulses with durations in the hundred nanoseconds region, the saturable inductor switch must have characteristics and be constructed in a manner differing from that of conventional saturable inductor switches such as those used in radar modulators and various solid state devices. The switch must be formed of a material having a very high permeability and a cross-sectional thickness on the order of the skin depth of the material at a frequency corresponding to the desired rise time of the output pulse. As taught by basic magnetic theory, application of a voltage across an inductor will induce a current and magnetic field build-up. If a permeable material is present, the magnetic field will be contained in the material up to the saturation limit. At this point, the permeability will drop to the free space value along with the inductance. This is the basis of saturable inductor switching. Incorporation of a highly permeable material in a normally fast system results in an inductive slow-down of the system. However, the highly permeable material may be configured in such a way as to saturate in a selected manner during charging and in doing so will switch in a low inductance fashion.

In order to accomplish this low inductance switching, the saturable inductor must be designed so that it saturates uniformly. This requires that the material thickness be within an order of magnitude of the skin depth at a frequency corresponding to the desired rise time of the output pulse. Failure to meet this requirement will result in slowing of the pulse rise time due to the time required for the saturation wave to propagate into the highly permeable material. For many types of EDGL's high voltage 10 nanosecond rise time pulse is desirable and therefore the skin depth criteria requires that the material thickness be on the order of 1 to 2 microns. Magnetic material films of this thickness can be obtained by deposition on a plastic insulator backing. These backings can be formed into a tape which is then wound around a suitable non-magnetic core material, thereby creating the saturable inductor switch. The magnetic material used should have a rectangular B-H hysteresis characteristic. By choosing the magnetic material to have a proper thickness as above-explained, a sharp transition between the two impedances of the switch, whose ratio may be many thousands to one, occurs, thereby producing the switching effect. In principle, there is no limitation by the saturable inductor switch as to the shortness of the pulse or the peak power that is obtainable utilizing a saturable inductor switch in conjunction with a distributed capacitance energy storage device as taught by the present invention. The amount of saturable inductor material must be sufficient to contain the induced magnetic field at the time of switching and is dependent on circuit and material properties.

Saturable inductor switches as above-described can also be cascaded to gradually narrow and sharpen an initial pulse. In addition, the highly permeable material can be magnetically biased so that the switch will saturate with pulses having one polarity but will not saturate with pulses of the same magnitude but having an opposite polarity.

An EDGL incorporating a saturable inductor switch as provided by the present invention has many advantages over conventional low inductance switches utilized for pulse shaping such as multichannel arc switches (rail gaps), thyratrons, spark gaps, or ignitrons. A switch according to the present invention can be operated at high repetition rates and at high powers and voltages. Secondly, a saturable inductor switch according to the present invention needs no external filament supplies, trigger pulses, or pressurized gases. Third and perhaps most importantly, the switch is non-destructive and will have a very long life time compared with conventional laser discharge circuit components.

BRIEF DESCRIPTION OF THE DRAWINGS

FIG. 6 is a further embodiment of the invention in which the distributed capacitance energy storage device is a parallel plate transmission line;

FIG. 7 is a cross-sectional perspective view taken along line 7—7 of FIG. 6;

FIG. 8 is a perspective view of the saturable inductor switch of FIG. 6 having the backing tape and high permeability magnetic material deposited thereon formed about the core;

FIG. 10 is an embodiment of the invention in which a magnetic biasing field is applied to the saturable inductor switch.

DETAILED DESCRIPTION

As required, detailed illustrative embodiments of the invention are disclosed herein. These embodiments exemplify the invention and are currently considered to be the best embodiments for such purposes. However, it is to be recognized that other distributed capacitance energy storage devices and saturable inductor switch configurations could be utilized with an electric discharge gas laser (EDGL). Accordingly, the specific embodiments disclosed are representative in providing a basis for the claims which define the scope of the present invention.

As previously explained, the invention provides a pulse shaping and impedance matching network and switch which can efficiently provide a high voltage output pulse of very short rise time and variable duration to an EDGL. A pulse shaping network according to the invention comprises a distributed capacitance energy storage device such as a coaxial line, multiple coaxial line, parallel plate transmission line, or two or more parallel-connected capacitors having an associated natural or added inductance, the energy storage device having its conductors connected to an EDGL. A saturable inductor switch is positioned in a magnetically coupling relationship to the transmission line so that as energy is provided at one end, a small amount of that energy is absorbed by the saturable inductor switch until the switch becomes saturated. At this time, the permeability of the switch drops to that of free space, and the energy contained within the distributed capacitance storage device is switched into the EDGL load. A plurality of saturable inductor switches can be cascaded with respect to the distributed capacitance energy storage device, each switch providing a further degree of pulse compression or shaping. In addition, the saturable inductor switch can be biased so that the switch saturates only on pulses of one voltage polarity, and does not saturate on pulses of the other voltage polarity.

Figure 1:
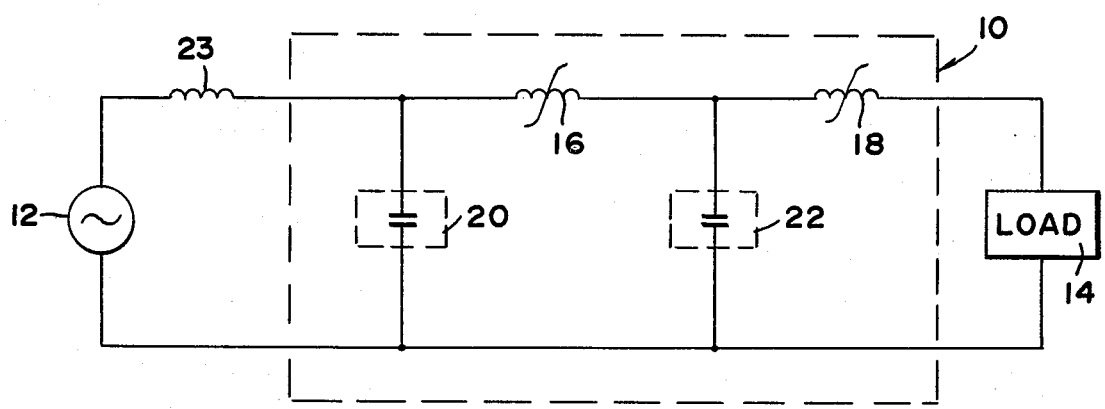
FIG. 1 is a schematic representation of a pulse shaping switch connecting a voltage source to a laser according to the present invention.

Referring now to FIG. 1, a pulse forming network 10 is shown, the network providing an electrical interface between a high voltage, high impedance source 12 and a relatively low impedance EDGL 14. The pulse forming network 10 comprises a first saturable inductor switch 16 of a unique configuration as will be explained below, and a second saturable inductor switch 18 which is substantially identical to the first saturable inductor switch 16. A first distributed capacitance energy storage device 20 is positioned between the voltage source 12 and the first saturable inductor switch 16 and a second distributed capacitance energy storage device 22 between the first and second saturable inductor switches 16 and 18, respectively. In addition, an input inductor 23 is located in series with the voltage source 12 and the first distributed capacitance energy storage device 20 in order to isolate the voltage generator 12 from the pulse forming network 10.

Although the first and second distributed capacitance energy storage devices 20 and 22 are shown functionally as single capacitors, it is essential that the capacitance storage be distributed rather than be contained within a single capacitor in order to obtain both the high voltage pulse rise times and pulse widths to be described below. Thus, an apparatus according to the invention will not operate as well in the high voltage/high energy region if only a single capacitor is utilized as in prior art systems. In FIG. 1 two saturable inductor switches 16 and 18 have been shown, however the actual number of switches to be utilized is determined by the input waveform from the voltage source 12 and the desired characteristics of the pulse to be supplied across the laser 14. A pulse forming network 10 as provided by the present invention with output pulses having a rise time and duration necessary for efficient excitation of EDGL's, the rise time being a function of the number of saturable inductor switches utilized and the physical dimensions and permeability characteristics of each switch as will be explained below.

A first embodiment of the invention utilizes a coaxial cable as the distributed capacitance energy storage device. Referring to FIGS. 2-5, the coaxial cable 24 is shown in two segments 26 and 28. The coaxial cable first segment 26 consists of a circular outer conductor 29 and a central conductor 30. Insulation, not shown, is provided between the outer conductor 29 and the central conductor 30. Distributed capacitance between the central and outer conductors 30 and 29 is represented by the dotted lines forming capacitors as shown by 34. These distributed capacitances 34 correspond to the first distributed capacitance energy storage device 20 shown in FIG. 1. Thus as one can appreciate, a voltage applied across the outer and central conductors 29 and 30, respectively, results in energy being stored along the coaxial cable segment 26 as represented by the dotted capacitors shown at 34. The voltage source 12, which could be a relatively high impedance MARX generator, has one output connected through the input inductor 23 to the central conductor 30 of the coaxial cable first segment 26. The other output from the voltage source 12 is connected to the outer conductor 29 of the coaxial cable first segment 26. A first saturable inductor switch 36 is positioned between the central and outer conductors 30 and 29 of the coaxial cable 24. This positioning could be effected in many ways, one of which is to locate the switch 36 between the coaxial cable first and second segments 26 and 28, respectively, the interface between the two cable segments being represented by the line 40. The first saturable inductor switch 36 is formed in the shape of a cylinder, thereby allowing one portion of the cylinder to extend into the coaxial cable first segment 26 and the other portion to extend into the coaxial cable second segment 28. In a similar manner, the coaxial cable second segment 28 corresponds to the second distributed capacitance energy storage device 22 shown in FIG. 1. A second saturable inductor switch 44 is provided between the end of the second coaxial cable segment 28 and the laser 14.

Figure 2:
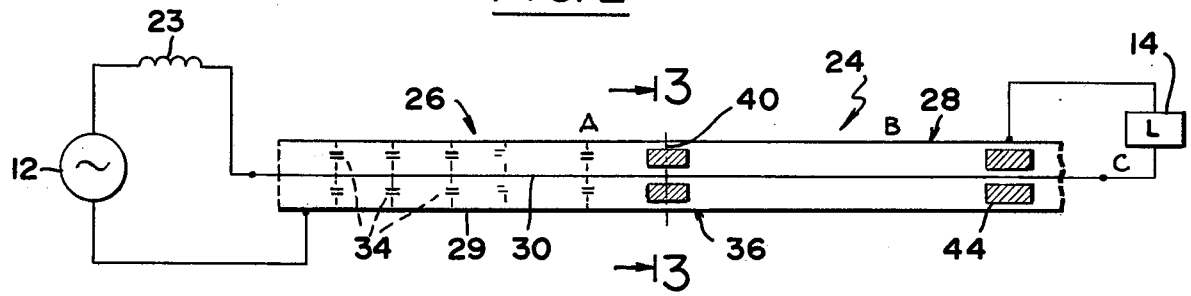
FIG. 2 is an embodiment of the pulse shaping switch in which the distributed capacitance energy storage device is a coaxial cable.
Figure 3:
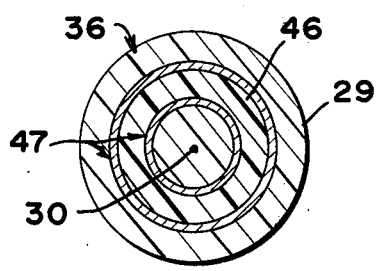
FIG. 3 is a cross-sectional view taken along line 3—3 of FIG. 2.

A cross-sectional view of the first saturable inductor switch 36 taken along 3—3 of FIG. 2 is shown in FIG. 3. As can be seen, the switch itself consists of a core 46 in the shape of a cylinder and formed of a non-magnetic material such as a plastic material. A laminate 47 comprising high permeability material is formed about the core 46.

Before explaining the structural details of a saturable inductor switch according to the present invention, a brief discussion of the characteristics of such a switch is appropriate. As basic electromagnetic theory teaches, application of a voltage across an inductor will induce a current and magnetic field build up. If a permeable material is present, the magnetic field will be contained in the material up to its saturation point. At this point, the permeability of the material will drop to its free space value along with the inductance. This is the basis of saturable inductor switching. Incorporation of a highly permeable material in a normally fast system results in an inductive slow down of the system. However, the highly permeable material may be configured in such a way as to saturate in a selected manner during charging and in doing so will discharge in a low inductance fashion. In order to effect this low inductance discharge, the saturable inductor switch must be configured so that it saturates uniformly. This requires a material thickness be within an order of magnitude of the skin depth at a frequency corresponding to the desired rise time of the output pulse. Failure to meet this requirement will result in slowing of the discharge pulse rise time due to the time required for the saturation wave to propagate into the highly permeable material. In order to provide an EDGL with a high voltage pulse of approximately 100 nanoseconds duration with a fast rise time on the order of a ten nanoseconds, it is necessary that the skin depth of the highly permeable material be in the order of one to two microns. Recent techniques have allowed a magnetic film of this thickness to be deposited on flexible sheets of non-magnetic backing material. In order to achieve a ten nanosecond output pulse rise time, a magnetic material having a permeability ($\mu$) greater than 2000 times that of free space ($\mu_0$) can be utilized, one such material being commonly known as Mumetal. However, materials having permeabilities as low as 500 times that of the permeability of free space can also be utilized.

Figure 4:
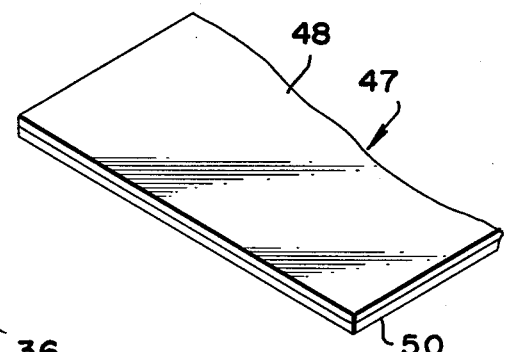
FIG. 4 is a perspective view of the backing tape having a thin layer of high permeability material deposited thereon.
Figure 5:
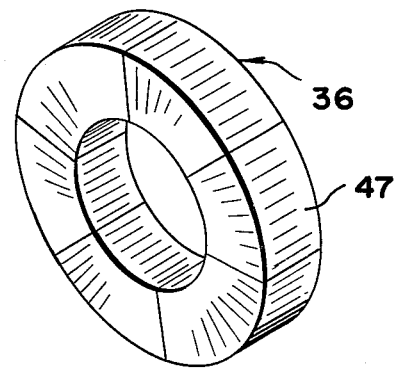
FIG. 5 is a perspective view showing a cylindrically shaped saturable inductor switch of the embodiment shown in FIG. 2 having the backing tape and high permeability magnetic material deposited thereon formed about the core.

Referring now to FIG. 4, the laminate 47 to be wound around the saturable inductor switch core 46 comprises a thin layer of high permeability material 48, such as Mumetal, deposited on a flexible sheet of non-magnetic backing material 50. This sheet then is wound around the switch core 46 as shown in FIG. 5, thereby providing a saturable inductor switch capable of operating in the nanosecond region. The laminate 47 can be layered about the core 46 as many times as necessary to provide a cross-sectional area of the high permeability material 48 as required to achieve saturation at the desired voltage level of the output pulse.

Again, as has been previously explained, in order to attain an output pulse of 100 nanoseconds duration with a fast rise time of approximately 10 nanoseconds it is essential that the energy released at the time the saturable inductor switch saturates be from a distributed capacitance energy storage device. A single capacitor cannot discharge rapidly enough to achieve nanosecond pulse rise times. The use of a saturable inductor switch for 100 nanosecond pulses therefore requires a feeding element which can itself deliver 100 nanosecond pulses. The switch is used as a "hold off" device. After the "hold off" period elapses, i.e., the switch saturates, the discharge current from the distributed capacitance storage device flows as though the saturable inductor were no longer there. One hundred nanosecond, multi-kilovolt pulses having energies greater than 100's of Joules cannot be obtained from conventional capacitors. Thus, a primary limitation of saturable switches in the prior art was their use of discrete components for switching. In order to achieve high voltage pulse rise times in the nanosecond range with pulse durations in the 100's of nanoseconds range, it is necessary to use transmission lines which are characterized by distributed capacitance and inductance parameters. Physically, the transmission lines may be of coaxial, multiple coaxial, folded plate or parallel plate geometry. Incorporation of the saturable inductor switch in such a transmission line allows pulse charging of the line behind the saturable inductor switch to a very high voltage. Upon saturation of the switch, the energy stored in the line is discharged into the laser with a rise time determined by the thickness of the permeable material comprising the switch.

Referring now to FIG. 6, a further embodiment of the invention is shown. In this embodiment, a pulsed voltage source 12 is connected through the input inductor 23 to a distributed capacitance storage device in the form of a parallel plate transmission line 60 comprising first and second segments 62 and 64, respectively. A first saturable inductor switch 66 is located between the first segment 62 of the parallel plate transmission line 60 and the second segment 64. A second saturable inductor switch 68 is located at the end of the second parallel plate transmission line segment 64. The parallel plate transmission line consists of an upper plate 70, a central plate 72 and a lower plate 74. The upper and lower plates 70 and 74, respectively, are connected to the return line from the laser 14 as shown at 75 and the central plate 72 is connected to the input of the laser 14.

Referring to the cross-sectional view shown in FIG. 7 it can be seen that the saturable inductor switch 66 provided for this embodiment is rectangularly shaped and has a core formed of a non-magnetic material as in the previous embodiment. Also, as in a previous embodiment, the core 76 is wrapped with the laminate 47 of high permeability magnetic material shown in FIG. 4. Referring now to FIGS. 7 and 8, the first saturable inductor switch 66 which is substantially identical to the second saturable inductor switch 68 is shown with the laminate 47 of magnetic material wound around the core 76. As in the previous embodiment utilizing a cylindrically shaped saturable inductor switch, this switch can have many layers of laminate 47 wrapped around the core 76, the number of layers being determined by the cross-sectional area necessary for the switch to saturate at a predetermined voltage level. Again, the magnetic material 48 of the laminate 47 should have a permeability ($\mu$) at least 500 times the permeability of free space ($\mu_0$). Preferably the permeability should be greater than 2000 times the permeability of free space.

Figure 9:
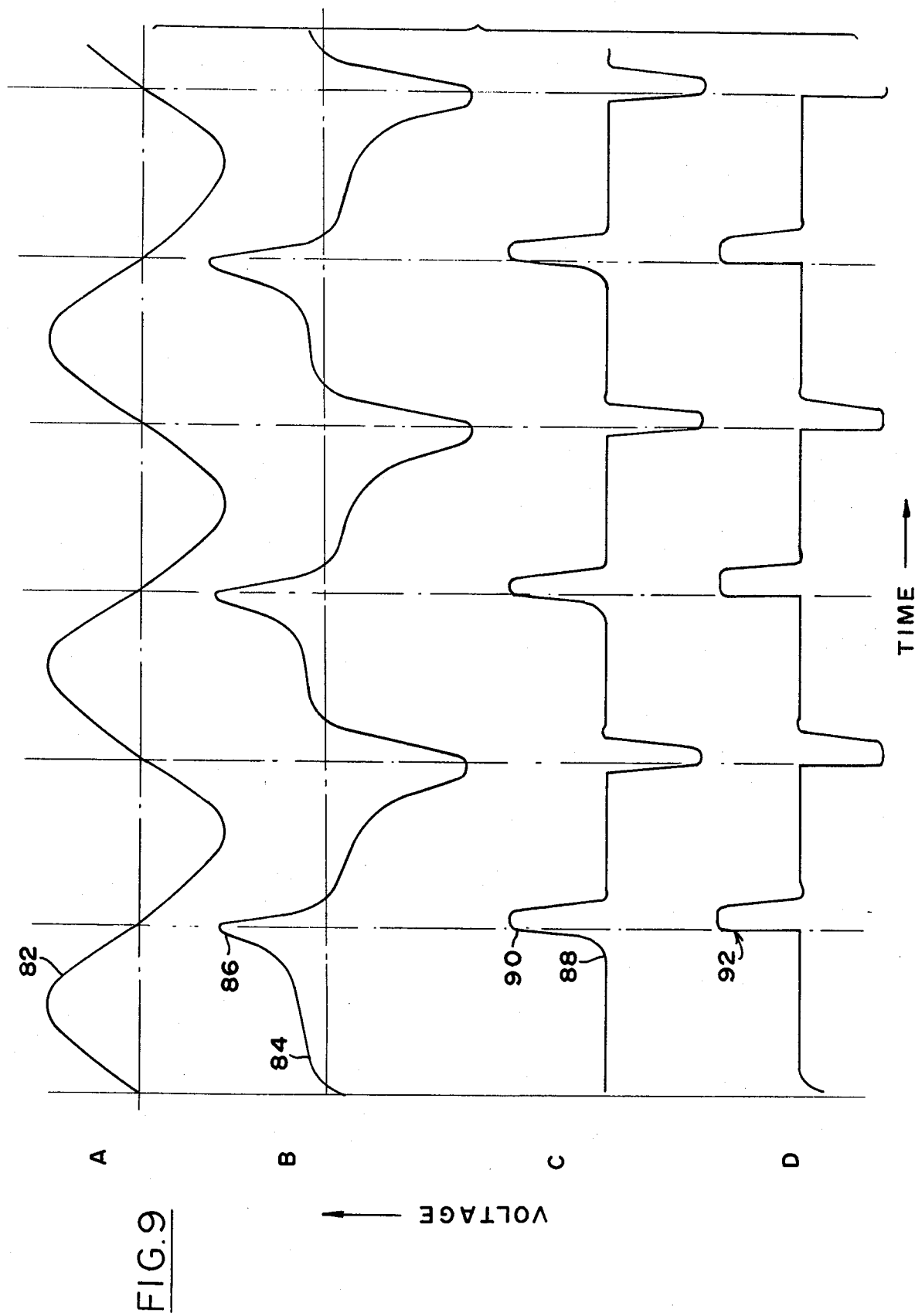
FIG. 9 is a representation of the various waveforms at the indicated points of FIG. 2.

In operation, the pulse forming network 10 can be best understood by referring to the waveforms of FIG. 9 in conjunction with the embodiment of FIG. 2. However, the waveforms would be substantially identical if the embodiment of FIG. 6 were utilized for illustrative purposes. As can be seen, the voltage versus time waveform at A is sinusoidal and represents the pulse charging of the coaxial cable first segment 26 through the input inductor 23 by the voltage source 12 as shown at 82. Although a sinusoidal voltage output from the voltage source 12 has been shown, the voltage source 12 could provide a pulsed output thereby requiring less pulse compression from the pulse forming network 10. The waveform B representing the pulse charging of the coaxial cable second segment 28 and corresponding to the voltage at point B in FIG. 2 shows a slow rate of voltage increase during the initial portion as shown at 84 and then upon saturation of the first saturable inductor 36 a rapid increase until it peaks as shown at 86. The second saturable inductor switch 44 then saturates thereby allowing the energy stored in the coaxial cable second segment 28 to discharge into the laser 14. As shown by waveform C, the second saturable inductor switch 44 saturates as shown at 88. The energy built-up in the distributed capacitance of the coaxial cable second segment 28 is discharged into the laser 14. As can be seen, pulse compression is effected because the pulse provided at the output of the second saturable inductor switch 44 as shown in waveform C begins only at the time the first saturable inductor switch 36 saturates as shown at 86. Because of the very short rise time of the charge buildup represented by waveform C, it can be appreciated by those skilled in the art that higher peak voltages can be obtained across a gas discharge laser as previously discussed with a slow rise time charging pulse. The duration of the relatively flat-topped portion 90 of waveform C corresponds to the two way electrical transit time of the coaxial cable second segment 28. This is typical of a pulse forming network discharge into an impedance matched load resulting in optimal energy transfer into the load. Additionally, due to the rapid rise between points 88 and 90 as shown in waveform C, pulse repetition rates can be determined much more precisely when desired for other purposes because the peak voltage will be more distinguishable. If a third coaxial segment and saturable inductor switch are inserted, further shortening of the rise time would be possible as shown in waveform D. Again, an advantage associated with the voltage pulse 92 of waveform D is that the energy contained in an extremely low impedance source, i.e., the distributed capacitance in the coaxial cable is optimally delivered to a laser. Thus maximum energy transfer can be obtained by the utilization of the pulse forming network of the present invention.

The invention also provides a magnetic bias source 94 as shown in FIG. 10. The magnetic bias source could be of several types such as an appropriately positioned permanent magnet or solenoid. This magnetic bias source 94 supplies a bias to the magnetic material 96 comprising a saturable inductor switch 98 positioned in a coaxial cable 99 as previously explained. The effect of this bias is to raise or lower the saturation voltage of the saturable inductor switch 98 with respect to the output voltage of the voltage source. The bias can be chosen with respect to the output voltage of the voltage source 12 so that only positive or negative excursions of the voltage source 12 will cause the saturable inductor switch 98 to saturate, thus effecting a protective measure for system components adversely affected by voltage reversals, or visa versa.

It should now be apparent that an appropriately configured saturable inductor switch when used in conjunction with a distributed capacitive device such as a coaxial line, multiple coaxial line, parallel plate transmission line, or two or more parallel-connected capacitors having an associated natural or added inductance can be utilized to shape pulses from a voltage source and provide high energy output pulses having durations less than one hundred nanoseconds and rise times on the order of a few nanoseconds EDGL.

What is claimed is:

1. A high speed pulse shaping switch for controlling energy from a high voltage, high impedance source to an electric discharge gas laser comprising:
    a distributed capacitance energy storage means connected to said voltage source and said laser; and
    a saturable inductor switch means positioned in magnetically coupling relationship with respect to said storage means to control current from said storage means to said laser and chosen so that it will saturate when said voltage source output voltage reaches a predetermined level, thereby discharging energy contained in said distributed capacitance energy storage means into said laser.

2. The pulse shaping switch of claim 1 in which said pulse shaping output impedance is lower than said voltage source impedance.

3. The pulse shaping switch of claim 1 in which said saturable inductor switch means comprises:
    a core formed of a non-magnetic material; and
    a sheet of high permeability material wound around said core, said sheet having a thickness within an order of magnitude of the skin depth of said high permeability material at a frequency corresponding to the rise time of an output pulse from said pulse shaping switch.

4. The pulse shaping switch of claim 3 in which said sheet of high permeability material has a permeability ($\mu$) at least equal to 2000 times the permeability of free space ($\mu_0$) and a thickness less than 5 microns.

5. The pulse shaping switch of claim 4 in which said sheet of high permeability material is deposited on a flexible sheet of non-magnetic material.

6. The pulse shaping switch of claim 3 in which said distributed capacitance energy storage means is a coaxial cable section having inner and outer conductors.

7. The pulse shaping switch of claim 6 in which said core is cylindrically shaped, said cable section inner conductor being disposed within said core and said cable section outer conductor being disposed about said core.

8. The pulse shaping switch of claim 3 in which said distributed capacitance energy storage means is a parallel plate transmission line having an inner plate and two outer plates.

9. The pulse shaping switch of claim 8 in which said core is rectangularly shaped, said inner plate being disposed within said core and said outer plates being disposed about said core.

10. The pulse shaping switch of claim 3 further comprising:
    a magnetic bias source; and
    means for coupling said bias source to said sheet of high permeability material.

11. The pulse shaping switch of claim 1 in which said saturable inductor switch means comprises a plurality of saturable inductor switches.

12. A pulse forming network for compressing voltage pulses produced by a pulse generator having positive and negative output terminals, comprising:
    a distributed capacitance energy storage device having one electrode connected to said pulse generator positive terminal and another electrode connected to said pulse generator negative terminal, both electrodes being connected across an electric discharge gas laser; and
    at least one saturable inductor switch positioned in magnetically coupling relationship with respect to one of said distributed capacitance energy storage device electrodes whereby said discharge device will discharge through said laser when said pulse generator output voltage reaches a predetermined level.

13. The pulse forming network of claim 12 in which said at least one saturable inductor switch comprises a plurality of saturable inductor switches.

14. The pulse forming network of claim 12 in which said distributed capacitance energy storage device is a coaxial cable.

15. The pulse forming networks of claim 12 in which said distributed capacitance energy storage is a parallel plate transmission line.

16. The pulse forming network of claim 12 in which said at least one saturable inductor switch comprises:
    a core formed of a non-magnetic material;
    a flexible sheet of non-magnetic backing material; and
    a layer of high permeability material having a permeability ($\mu$) at least 500 times greater than the permeability of free space ($\mu_0$) deposited on said backing material, said high permeability material having a thickness no greater than 5 microns, said backing material and deposited material being formed about said core.

17. The pulse forming network of claim 16 further comprising:
    a magnetic bias source; and
    means for connecting said bias source to said high permeability material.

18. A pulse shaping switch and impedance matching circuit for activating an electric discharge gas laser by a pulse generator having a higher output impedance than that of said electric discharge gas laser, comprising:
    a distributed capacitance energy storage device connected across said laser and to said pulse generator; and
    at least one saturable inductor switch in magnetically coupling relationship to said distributed capacitance energy storage device, comprising:
    a core;
    a flexible sheet of non-magnetic backing material; and
    a layer of high permeability material having a permeability ($\mu$) at least 2000 times greater than the permeability of free space ($\mu_0$) deposited on said sheet of backing material, said high permeability material having a thickness no greater than 5 microns, said backing material and deposited material being formed about said core;
    whereby said discharge device will discharge through said laser when said pulse generator output voltage reaches a predetermined level.

19. The circuit of claim 18 in which said at least one saturable inductor switch comprises a plurality of saturable inductor switches.

* * * * *